United States Patent
Huang et al.

(10) Patent No.: US 12,223,567 B2
(45) Date of Patent: Feb. 11, 2025

(54) MR IMAGING METHOD AND APPARATUS AND COMPUTER-READABLE STORAGE MEDIUM

(71) Applicant: Siemens Healthcare GmbH, Erlangen (DE)

(72) Inventors: Yan Tu Huang, Shenzhen (CN); Fang Dong, Shenzhen (CN)

(73) Assignee: Siemens Healthineers AG, Erlangen (DE)

( * ) Notice: Subject to any disclaimer, the term of this patent is extended or adjusted under 35 U.S.C. 154(b) by 21 days.

(21) Appl. No.: 17/956,964

(22) Filed: Sep. 30, 2022

(65) Prior Publication Data

US 2023/0112929 A1    Apr. 13, 2023

(30) Foreign Application Priority Data

Sep. 30, 2021 (CN) .......................... 202111160101.1

(51) Int. Cl.
*G06T 11/00* (2006.01)
*G01R 33/48* (2006.01)
(Continued)

(52) U.S. Cl.
CPC ........ *G06T 11/005* (2013.01); *G01R 33/4818* (2013.01); *G01R 33/4826* (2013.01);
(Continued)

(58) Field of Classification Search
CPC ..... G06T 11/005; G06T 7/30; G01R 33/4818; G01R 33/4826; G01R 33/56509; G01R 33/5673; G01R 33/4835
See application file for complete search history.

(56) References Cited

U.S. PATENT DOCUMENTS

2022/0230318 A1    7/2022    Huang

FOREIGN PATENT DOCUMENTS

| WO | 2015092062 A1 | 6/2015 |
| WO | 2019145527 A1 | 8/2019 |

OTHER PUBLICATIONS

Solomon, Eddy, et al. "Free-breathing radial imaging using a pilot-tone radiofrequency transmitter for detection of respiratory motion." Magnetic resonance in medicine 85.5 (Dec. 11, 2020): 2672-2685. (Year: 2020).*

(Continued)

*Primary Examiner* — Rishi R Patel
(74) *Attorney, Agent, or Firm* — Banner & Witcoff Ltd.

(57) ABSTRACT

An MR imaging method and apparatus and a computer-readable storage medium. The method includes: collecting MR signal data every set time interval according to a stack-of-stars scheme or stack-of-spirals scheme, where in each time interval, MR signal data of each of a plurality of parallel slices arranged along a slice direction is collected as a k-space slice, and the k-space slices of the plurality of parallel slices are stacked into a k-space column along the slice direction; in a process of collecting the MR signal data, performing motion detection by utilizing a pilot tone signal, and marking MR signal data collected during a body motion as motion damage data when the body motion is detected; and performing motion correction on MR signal data after the motion damage data for k-space columns successively collected in a plurality of time intervals, and obtaining a current MR image based on MR signal data obtained after the motion correction and MR signal data before the motion damage data.

14 Claims, 5 Drawing Sheets

(51) Int. Cl.
*G01R 33/483* (2006.01)
*G01R 33/565* (2006.01)
*G01R 33/567* (2006.01)
*G06T 7/30* (2017.01)

(52) U.S. Cl.
CPC ... *G01R 33/56509* (2013.01); *G01R 33/5673* (2013.01); *G06T 7/30* (2017.01); *G01R 33/4835* (2013.01)

(56) References Cited

OTHER PUBLICATIONS

Vahle, Thomas, et al. "Respiratory motion detection and correction for MR using the pilot tone: applications for MR and simultaneous PET/MR examinations." Investigative radiology 55.3 (2020): 153-159. (Year: 2020).*
Zaitsev, Maxim et al.: "Motion Artifacts in MRI: A Complex Problem With Many Partial Solutions"; in: Journal of Magnetic Resonance Imaging; vol. 42; Issue 4; pp. 887-901; 2015; DOI: 10.1002/jmri.24850.

* cited by examiner

MR IMAGING METHOD AND APPARATUS AND COMPUTER-READABLE STORAGE MEDIUM

TECHNICAL FIELD

The present disclosure relates to the field of magnetic resonance (MR) imaging technologies, and in particular, to an MR imaging method and apparatus and a computer-readable storage medium.

BACKGROUND

MR imaging is an imaging technique using a magnetic resonance phenomenon. The principles of MR imaging are mainly as follows: nuclei containing an odd number of protons, for example, hydrogen nuclei widely existing in a human body, the protons thereof are in a spin motion, like small magnets, and the small magnets have irregular axes of spin. If an external magnetic field is applied, the small magnets will be rearranged according to magnetic lines of force of the external magnetic field, and are specifically arranged in two directions, i.e., directions parallel to and anti-parallel to the magnetic lines of force of the external magnetic field. The direction parallel to the magnetic lines of force of the external magnetic field mentioned above is referred to as a positive longitudinal axis, and the direction anti-parallel to the magnetic lines of force of the external magnetic field mentioned above is referred to as a negative longitudinal axis. The nuclei only have a longitudinal magnetization component that has both a direction and an amplitude. Nuclei in the external magnetic field are excited by radio frequency (RF) pulses at a specific frequency such that the axes of spin of the nuclei deviate from the positive longitudinal axis or the negative longitudinal axis so as to produce resonance, which is the magnetic resonance phenomenon. After the axes of spin of the excited nuclei mentioned above deviate from the positive longitudinal axis or the negative longitudinal axis, the nuclei have a transverse magnetization component.

After the radio frequency pulses stop being transmitted, the excited nuclei transmit echo signals and gradually release the absorbed energy in the form of electromagnetic waves. Both the phase and energy level thereof are restored to the state before being excited, and the echo signals transmitted by the nuclei are subjected to further processing such as space encoding such that the image can be reconstructed. The above process of the excited nuclei being recovered to the state before being excited is referred to as a relaxation process, and the time required for recovery to an equilibrium state is referred to as a relaxation time.

MRI imaging includes images of various cross sections in a desired direction. A k space is a data space of each cross section, that is, k-space data represents a group of original data that can form a cross section image. For example, after echo data of a k space is acquired by using a three-dimensional fast gradient echo sequence, the echo data is filled into a phase-encoded k space. Then, a desired image can be obtained by performing a Fourier transform on the k-space data.

There are various collection methods for collecting the k-space data. For example, the k-space data may be collected by using in-plane rotated k-space sampling profiles such as stack-of-stars or stack-of-spirals trajectories. A stack-of-stars scheme or stack-of-spirals scheme is very robust to a periodic motion such as a respiratory motion, however it is still affected by body motions such as a sudden body motion.

Therefore, those skilled in the art are still working on finding a body motion compensation scheme for MR imaging when data collection is performed by using the stack-of-stars scheme or the stack-of-spirals scheme.

SUMMARY

In view of this, aspects of the present disclosure provide an MR imaging method in an aspect, and an MR imaging apparatus and a computer-readable storage medium in other aspects, to improve MR imaging quality.

The MR imaging method proposed in an aspect of the present disclosure includes: collecting MR signal data every set time interval according to a stack-of-stars scheme or stack-of-spirals scheme, where in each time interval, MR signal data of each of a plurality of parallel slices arranged adjacently along a slice direction is collected as a radially-filled k-space slice or a spirally-filled k-space slice, and the k-space slices of the plurality of parallel slices are stacked into a k-space column along the slice direction; in a process of collecting the MR signal data, performing motion detection by utilizing a pilot tone signal received by a plurality of coils, and marking MR signal data collected during a body motion as motion damage data when the body motion is detected; and performing motion correction on MR signal data after the motion damage data for k-space columns successively collected in a plurality of time intervals, and obtaining a current MR image based on MR signal data obtained after the motion correction and MR signal data before the motion damage data.

In an implementation, the performing motion correction on MR signal data after the motion damage data for k-space columns successively collected in a plurality of time intervals, and obtaining a current MR image based on MR signal data obtained after the motion correction and MR signal data before the motion damage data includes: taking a k-space column with motion damage data from the k-space columns successively collected in a plurality of time intervals as a lossy k-space column, where the number of lossy k-space columns is 1; calculating a correction parameter by utilizing reconstructed images of adjacent lossless k-space columns before and after the lossy k-space column, and performing correction on a reconstructed image of each lossless k-space column after the lossy k-space column by utilizing the calculated correction parameter, to obtain a corrected reconstructed image; and superimposing the corrected reconstructed image and a reconstructed image of each lossless k-space column before the lossy k-space column to obtain the current MR image.

In an implementation, the performing motion correction on MR signal data after the motion damage data for k-space columns successively collected in a plurality of time intervals, and obtaining a current MR image based on MR signal data obtained after the motion correction and MR signal data before the motion damage data further includes: repairing the lossy k-space column to obtain a reconstructed image of a repaired k-space column, and superimposing the reconstructed image of the repaired k-space column and the current MR image to obtain a current MR image.

In an implementation, the repairing the lossy k-space column to obtain a reconstructed image of a repaired k-space column includes:

performing re-collection for the lossy k-space column, and performing correction on a reconstructed image of a re-collected k-space column by utilizing the correction parameter, to obtain a reconstructed image of a repaired k-space column; or includes:

taking a k-space slice with motion damage data in the lossy k-space column as a lossy k-space slice;

performing correction on each k-space slice after the lossy k-space slice in the lossy k-space column by utilizing the correction parameter, to obtain a corrected k-space slice;

removing the lossy k-space slice; or performing re-collection for the lossy k-space slice, and performing correction on a re-collected k-space slice by utilizing the correction parameter, to obtain a repaired k-space slice; or performing re-collection for the motion damage data in the lossy k-space slice, and performing correction on re-collected data and data after the motion damage data in the lossy k-space slice by utilizing the correction parameter, to obtain a repaired k-space slice; and performing image reconstruction on an obtained repaired k-space column to obtain a reconstructed image of the repaired k-space column.

In an implementation, the performing motion correction on MR signal data after the motion damage data for k-space columns successively collected in a plurality of time intervals, and obtaining a current MR image based on MR signal data obtained after the motion correction and MR signal data before the motion damage data includes:

taking a k-space column with motion damage data from the k-space columns successively collected in a plurality of time intervals as a lossy k-space column, where the number of lossy k-space columns is greater than 1;

taking an adjacent lossless k-space column before the first lossy k-space column as a reference k-space column, and performing image reconstruction on the reference k-space column to obtain a reference image; and performing the following operations for each current lossy k-space column:

a. performing image reconstruction on an adjacent lossless k-space column after the current lossy k-space column to obtain a correction image corresponding to the current lossy k-space column;

b. performing registration on the correction image by utilizing the reference image, to obtain a correction parameter corresponding to the current lossy k-space column;

c. performing correction on a reconstructed image of each lossless k-space column after the current lossy k-space column and before a next lossy k-space column by utilizing the correction parameter, to obtain a corrected reconstructed image; and superimposing a reconstructed image of each lossless k-space column before the first lossy k-space column and each corrected reconstructed image to obtain the current MR image.

In an implementation, the following operations are further performed for each current lossy k-space column: repairing the current lossy k-space column to obtain a reconstructed image of a repaired k-space column, and superimposing the reconstructed image of the repaired k-space column and the current MR image to obtain a current MR image.

In an implementation, the repairing of the current lossy k-space column to obtain a reconstructed image of a repaired k-space column includes:

performing re-collection for the current lossy k-space column, and performing correction on a reconstructed image of a re-collected k-space column by utilizing a correction parameter corresponding to the last lossy k-space column, to obtain the reconstructed image of the repaired k-space column; or includes:

taking a k-space slice with motion damage data in the current lossy k-space column as a lossy k-space slice;

performing correction on each k-space slice after the lossy k-space slice in the current lossy k-space column by utilizing the correction parameter corresponding to the current lossy k-space column, to obtain a corrected k-space slice; and if the current lossy k-space column is not the first lossy k-space column, performing correction on each k-space slice before the lossy k-space slice by utilizing a correction parameter corresponding to a previous lossy k-space column, to obtain a corrected k-space slice;

removing the lossy k-space slice; or performing re-collection for the lossy k-space slice, and performing correction on a re-collected k-space slice by utilizing a correction parameter corresponding to the last lossy k-space column, to obtain a repaired k-space slice; or performing re-collection for the motion damage data in the lossy k-space slice, performing correction on re-collected data by utilizing the correction parameter corresponding to the last lossy k-space column, and performing correction on data after the motion damage data in the lossy k-space slice by utilizing the correction parameter corresponding to the current lossy k-space column; and if the current lossy k-space column is not the first lossy k-space column, performing correction on the data before the motion damage data in the lossy k-space slice by utilizing a correction parameter corresponding to a previous lossy k-space column, to obtain a repaired k-space slice; and performing image reconstruction on an obtained repaired k-space column to obtain a reconstructed image of the repaired k-space column.

The MR imaging apparatus proposed in an aspect of the present disclosure includes: a signal collection module, configured to collect MR signal data every set time interval according to a stack-of-stars scheme or stack-of-spirals scheme, where in each time interval, MR signal data of each of a plurality of parallel slices arranged adjacently along a slice direction is collected as a radially-filled k-space slice or a spirally-filled k-space slice, and the k-space slices of the plurality of parallel slices are stacked into a k-space column along the slice direction; a motion detection module, configured to: in a process of collecting the MR signal data, perform motion detection by utilizing a pilot tone signal received by a plurality of coils, and output a corresponding body motion signal when a body motion is detected; and a motion correction and imaging module, configured to mark MR signal data collected during the body motion as motion damage data based on the body motion signal; and perform motion correction on MR signal data after the motion damage data for k-space columns successively collected in a plurality of time intervals, and obtain a current MR image based on MR signal data obtained after the motion correction and MR signal data before the motion damage data.

In an implementation, the motion correction and imaging module takes a k-space column with motion damage data from the k-space columns successively collected in a plurality of time intervals as a lossy k-space column, and when the number of lossy k-space columns is 1, calculates a correction parameter by utilizing reconstructed images of adjacent lossless k-space columns before and after the lossy k-space column, and performs correction on a reconstructed image of each lossless k-space column after the lossy k-space column by utilizing the calculated correction parameter, to obtain a corrected reconstructed image; and superimposes the corrected reconstructed image and a reconstructed image of each lossless k-space column before the lossy k-space column to obtain the current MR image.

In an implementation, the motion correction and imaging module further repairs the lossy k-space column to obtain a reconstructed image of a repaired k-space column, and superimposes the reconstructed image of the repaired k-space column and the current MR image to obtain a current MR image.

In an implementation, the motion correction and imaging module performs re-collection for the lossy k-space column, and performs correction on a reconstructed image of a re-collected k-space column by utilizing the correction parameter, to obtain a reconstructed image of a repaired k-space column; or takes a k-space slice with motion damage data in the lossy k-space column as a lossy k-space slice;
  performs correction on each k-space slice after the lossy k-space slice in the lossy k-space column by utilizing the correction parameter, to obtain a corrected k-space slice;
  removes the lossy k-space slice; or performs re-collection for the lossy k-space slice, and performing correction on a re-collected k-space slice by utilizing the correction parameter, to obtain a repaired k-space slice; or performs re-collection for the motion damage data in the lossy k-space slice, and performing correction on re-collected data and data after the motion damage data in the lossy k-space slice by utilizing the correction parameter, to obtain a repaired k-space slice; and
  performs image reconstruction on an obtained repaired k-space column to obtain a reconstructed image of the repaired k-space column.

In an implementation, the motion correction and imaging module takes a k-space column with motion damage data from the k-space columns successively collected in a plurality of time intervals as a lossy k-space column, and when the number of lossy k-space columns is greater than 1, takes an adjacent lossless k-space column before the first lossy k-space column as a reference k-space column, and performs image reconstruction on the reference k-space column to obtain a reference image; and
  performs the following operations for each current lossy k-space column:
  a. performing image reconstruction on an adjacent lossless k-space column after the current lossy k-space column to obtain a correction image corresponding to the current lossy k-space column;
  b. performing registration on the correction image by utilizing the reference image, to obtain a correction parameter corresponding to the current lossy k-space column;
  c. performing correction on a reconstructed image of each lossless k-space column after the current lossy k-space column and before a next lossy k-space column by utilizing the correction parameter, to obtain a corrected reconstructed image; and
  superimposing a reconstructed image of each lossless k-space column before the first lossy k-space column and each corrected reconstructed image to obtain the current MR image.

In an implementation, for each current lossy k-space column, the motion correction and imaging module further repairs the current lossy k-space column to obtain a reconstructed image of a repaired k-space column, and superimposes the reconstructed image of the repaired k-space column and the current MR image to obtain a current MR image.

In an implementation, the motion correction and imaging module performs re-collection for the current lossy k-space column, and performs correction on a reconstructed image of a re-collected k-space column by utilizing a correction parameter corresponding to the last lossy k-space column, to obtain the reconstructed image of the repaired k-space column; or takes a k-space slice with motion damage data in the current lossy k-space column as a lossy k-space slice;
  performs correction on each k-space slice after the lossy k-space slice in the current lossy k-space column by utilizing the correction parameter corresponding to the current lossy k-space column, to obtain a corrected k-space slice;
  if the current lossy k-space column is not the first lossy k-space column, performs correction on each k-space slice before the lossy k-space slice by utilizing a correction parameter corresponding to a previous lossy k-space column, to obtain a corrected k-space slice;
  removes the lossy k-space slice; performs re-collection for the motion damage data in the lossy k-space slice, performs correction on re-collected data by utilizing the correction parameter corresponding to the last lossy k-space column, and performs correction on data after the motion damage data in the lossy k-space slice by utilizing the correction parameter corresponding to the current lossy k-space column; and if the current lossy k-space column is not the first lossy k-space column, performs correction on the data before the motion damage data in the lossy k-space slice by utilizing a correction parameter corresponding to a previous lossy k-space column, to obtain a repaired k-space slice; and
  performs image reconstruction on an obtained repaired k-space column to obtain a reconstructed image of the repaired k-space column.

Another MR imaging apparatus proposed in an aspect of the present disclosure includes: at least one memory and at least one processor, where the at least one memory is configured to store a computer program; and the at least one processor is configured to invoke the computer program stored in the at least one memory to perform the MR imaging method according to any one of the above implementations.

The computer-readable storage medium provided in an aspect of the present disclosure has a computer program stored thereon, where the computer program is capable of being executed by a processor to implement the MR imaging method according to any one of the above implementations.

It can be seen from the above solutions that, in the aspects of the present disclosure, the pilot tone signal is utilized to perform motion detection, the MR signal data collected during a body motion is marked as the motion damage data, then the MR signal data after the motion damage data is subjected to motion correction, and the current MR image is obtained based on the MR signal data obtained after the motion correction and MR signal data before the motion damage data, so that the collected image can be accurately corrected, thereby improving the MR imaging quality.

During MR imaging, the k-space column with the motion damage data is removed, so that the collected image is accurately corrected while an imaging speed may be increased. The k-space column with the motion damage data is repaired, so that the collected image is accurately corrected while the resolution of the image may be increased.

BRIEF DESCRIPTION OF THE DRAWINGS

The above and other features and advantages of the present disclosure will be more apparent to those of ordinary skill in the art from the detailed description of preferred aspects of the present disclosure with reference to the accompanying drawings, in which.

Figure 1:
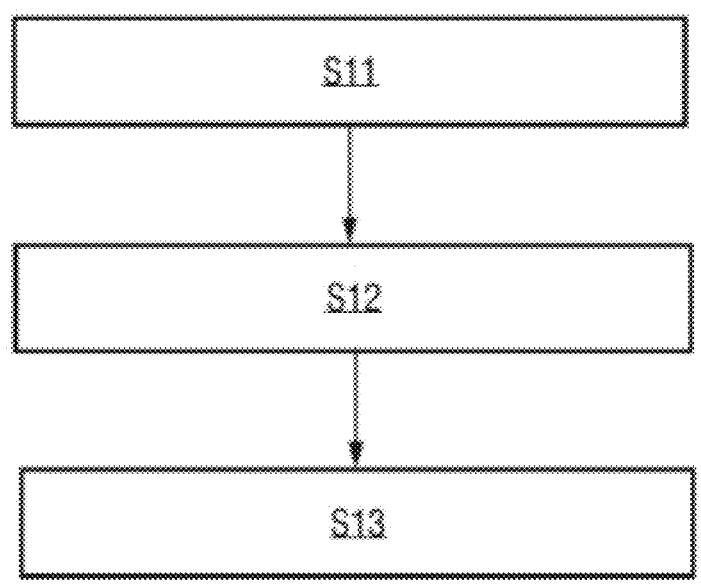
FIG. 1 is an exemplary flowchart of an MR imaging method in an aspect of the present disclosure.

Reference numerals in the accompanying drawings are as follows:

| Reference numeral | Meaning |
| --- | --- |
| S11-S13, S41-S46 | Steps |
| 21 | K-space column |
| 211 | K-space slice |
| 31 | Local coil |
| 311 | Transmitting antenna |
| 32 | A/D conversion |
| 33 | Pre-processing |
| 34 | Signal region corresponding to a body motion |
| 501 | Signal collection module |
| 502 | Motion detection module |
| 503 | Motion correction and imaging module |
| 61 | Memory |
| 62 | Processor |
| 63 | Display |
| 64 | Bus |

DETAILED DESCRIPTION

In the aspects of the present disclosure, it is considered to incorporate body motion detection into the processes of stack-of-stars or stack-of-spirals data collection and MR imaging. For stack-of-stars, the center of k-space may be used for motion detection. However, the pilot tone signal shows a better time resolution and higher sensitivity than the k-space center detection method, and therefore, it is considered to detect the body motion by utilizing the pilot tone signal in the aspects of the present disclosure.

In order to make the objectives, technical solutions, and advantages of the present disclosure more apparent, the present disclosure will be described in further detail by way of aspects hereinafter.

FIG. 1 is an exemplary flowchart of an MR imaging method in an aspect of the present disclosure. As shown in FIG. 1, the method may include the following operations.

In step S11, MR signal data is collected every set time interval according to a stack-of-stars scheme or stack-of-spirals scheme, where in each time interval, MR signal data of each of a plurality of parallel slices arranged adjacently along a slice direction is collected as a radially-filled k-space slice or a spirally-filled k-space slice, and the k-space slices of the plurality of parallel slices are stacked into a k-space column along the slice direction.

Figure 2:
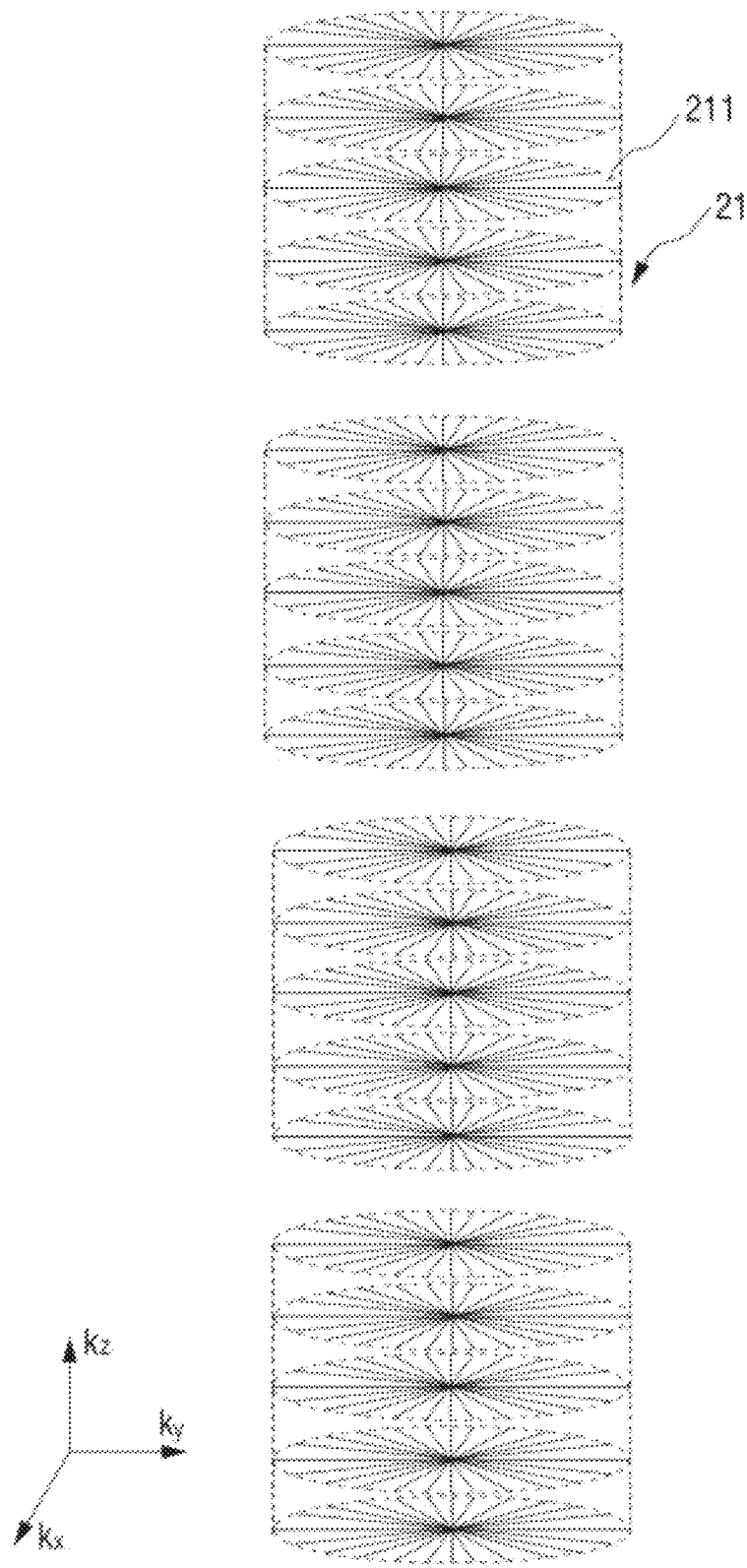
FIG. 2 is a schematic diagram of k-space data for five parallel slices collected in four time intervals according to a stack-of-stars scheme in an example of the present disclosure.

FIG. 2 shows k-space data for five parallel slices collected in four time intervals by taking a stack-of-stars scheme as an example. As shown in FIG. 2, each k-space column 21 includes five k-space slices 211, where k: represents the slice direction. In this aspect, radial k-space sampling in the $k_x$-$k_y$ plane and Cartesian sampling along the k: direction may be used. An equidistant radial sampling scheme with multiple interleaves or a golden-angle radial sampling scheme may be used.

In step S12, in a process of collecting the MR signal data, motion detection is performed by utilizing a pilot tone signal received by a plurality of coils, and MR signal data collected during a body motion is marked as motion damage data when the body motion is detected.

In this aspect, there are various implementation methods for performing motion detection by utilizing a pilot tone signal. For example, FIG. 3A and FIG. 3B are schematic diagrams showing performing motion detection by utilizing a pilot tone signal in an example.

Figure 3A:
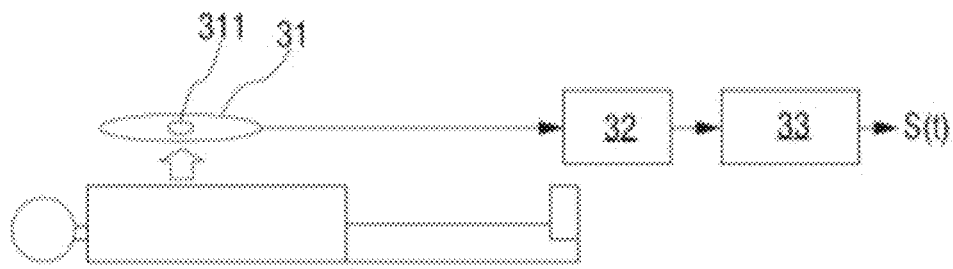
FIG. 3A and FIG. 3B are schematic diagrams of performing motion detection by utilizing a pilot tone signal in an example of the present disclosure.
Figure 3B:
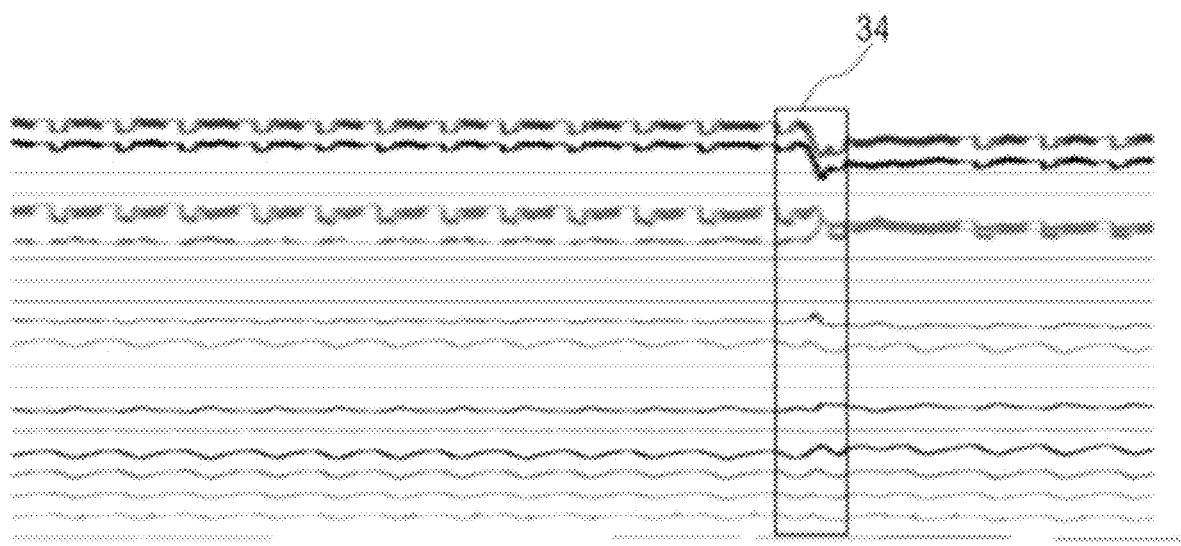

As shown in FIG. 3A, in an MR imaging system, a transmitting antenna 311 may be provided in the local coil 31 and configured to transmit a radio frequency signal with a frequency slightly lower or higher than the MR center frequency, then the radio frequency signal is modulated by breathing/heartbeat or a body motion, and the modulated signal may be received by an MR receiving coil. A digitized motion modulated pilot tone signal S(t) is obtained through A/D conversion 32 and pre-processing (filtering out the MR signal) 33. FIG. 3B shows a motion-modulated pilot tone signal in an example, and as shown in FIG. 3B, a signal region 34 corresponding to a body motion may be obtained by detecting the motion-modulated pilot tone signal.

In step S13, motion correction is performed on MR signal data after the motion damage data for k-space columns successively collected in a plurality of time intervals, and a current MR image is obtained based on MR signal data obtained after the motion correction and MR signal data before the motion damage data.

Step S13 may have a plurality of specific implementations. Several of these implementations are listed below:

Implementation 1

A k-space column with motion damage data from the k-space columns successively collected in a plurality of time intervals is taken as a lossy k-space column, where the number of lossy k-space columns is 1;

- a correction parameter is calculated by utilizing reconstructed images of adjacent lossless k-space columns before and after the lossy k-space column, and correction is performed on a reconstructed image of each lossless k-space column after the lossy k-space column by utilizing the calculated correction parameter, to obtain a corrected reconstructed image; and
- the corrected reconstructed image and a reconstructed image of each lossless k-space column before the lossy k-space column are superimposed to obtain the current MR image.

Implementation 2

On the basis of Implementation 1, the following is further included: The lossy k-space column is repaired to obtain a reconstructed image of a repaired k-space column, and the reconstructed image of the repaired k-space column and the current MR image are superimposed to obtain a current MR image.

A method for repairing the lossy k-space column to obtain the reconstructed image of the repaired k-space column may also be implemented in a plurality of manners, and several of these manners are listed below:

Manner 1

Re-collection is performed for the lossy k-space column, and correction is performed on a reconstructed image of a re-collected k-space column by utilizing the correction parameter, to obtain a reconstructed image of a repaired k-space column.

Manner 2

A k-space slice with motion damage data in the lossy k-space column is taken as a lossy k-space slice;
  correction is performed on each k-space slice after the lossy k-space slice in the lossy k-space column by utilizing the correction parameter, to obtain a corrected k-space slice;
  the lossy k-space slice is removed; and
  image reconstruction is performed on an obtained repaired k-space column to obtain a reconstructed image of the repaired k-space column.

Manner 3

A k-space slice with motion damage data in the lossy k-space column is taken as a lossy k-space slice;
  correction is performed on each k-space slice after the lossy k-space slice in the lossy k-space column by utilizing the correction parameter, to obtain a corrected k-space slice;
  re-collection is performed for the lossy k-space slice, and correction is performed on a re-collected k-space slice by utilizing the correction parameter, to obtain a repaired k-space slice; and
  image reconstruction is performed on an obtained repaired k-space column to obtain a reconstructed image of the repaired k-space column.

Manner 4

A k-space slice with motion damage data in the lossy k-space column is taken as a lossy k-space slice;
  correction is performed on each k-space slice after the lossy k-space slice in the lossy k-space column by utilizing the correction parameter, to obtain a corrected k-space slice;
  re-collection is performed for the motion damage data in the lossy k-space slice, and correction is performed on re-collected data and data after the motion damage data in the lossy k-space slice by utilizing the correction parameter, to obtain a repaired k-space slice; and
  image reconstruction is performed on an obtained repaired k-space column to obtain a reconstructed image of the repaired k-space column.

Implementation 3

A k-space column with motion damage data from the k-space columns successively collected in a plurality of time intervals is taken as a lossy k-space column, where the number of lossy k-space columns is greater than 1;
  an adjacent lossless k-space column before the first lossy k-space column is taken as a reference k-space column, and image reconstruction is performed on the reference k-space column to obtain a reference image; and
  the following operations are performed for each current lossy k-space column:
  a. performing image reconstruction on an adjacent lossless k-space column after the current lossy k-space column to obtain a correction image corresponding to the current lossy k-space column;
  b. performing registration on the correction image by utilizing the reference image, to obtain a correction parameter corresponding to the current lossy k-space column;
  c. performing correction on a reconstructed image of each lossless k-space column after the current lossy k-space column and before a next lossy k-space column by utilizing the correction parameter, to obtain a corrected reconstructed image; and
  superimposing a reconstructed image of each lossless k-space column before the first lossy k-space column and each corrected reconstructed image to obtain the current MR image.

Implementation 4

On the basis of Implementation 3, the following operations are further performed for each current lossy k-space column: repairing the current lossy k-space column to obtain a reconstructed image of a repaired k-space column, and superimposing the reconstructed image of the repaired k-space column and the current MR image to obtain a current MR image.

A method for repairing the current lossy k-space column to obtain the reconstructed image of the repaired k-space column may also be implemented in a plurality of manners, and several of these manners are listed below:

Manner 1

Re-collection is performed for the current lossy k-space column, and correction is performed on a reconstructed image of a re-collected k-space column by utilizing a correction parameter corresponding to the last lossy k-space column, to obtain the reconstructed image of the repaired k-space column.

Manner 2

A k-space slice with motion damage data in the current lossy k-space column is taken as a lossy k-space slice;
  correction is performed on each k-space slice after the lossy k-space slice in the current lossy k-space column by utilizing the correction parameter corresponding to the current lossy k-space column, to obtain a corrected k-space slice; and if the current lossy k-space column is not the first lossy k-space column, correction is performed on each k-space slice before the lossy k-space slice by utilizing a correction parameter corresponding to a previous lossy k-space column, to obtain a corrected k-space slice;
  the lossy k-space slice is removed; and
  image reconstruction is performed on an obtained repaired k-space column to obtain a reconstructed image of the repaired k-space column.

Manner 3

A k-space slice with motion damage data in the current lossy k-space column is taken as a lossy k-space slice;
correction is performed on each k-space slice after the lossy k-space slice in the current lossy k-space column by utilizing the correction parameter corresponding to the current lossy k-space column, to obtain a corrected k-space slice; and if the current lossy k-space column is not the first lossy k-space column, correction is performed on each k-space slice before the lossy k-space slice by utilizing a correction parameter corresponding to a previous lossy k-space column, to obtain a corrected k-space slice;
re-collection is performed for the lossy k-space slice, and correction is performed on a re-collected k-space slice by utilizing the correction parameter corresponding to the last lossy k-space column, to obtain a repaired k-space slice; and
image reconstruction is performed on an obtained repaired k-space column to obtain a reconstructed image of the repaired k-space column.

Manner 4

A k-space slice with motion damage data in the current lossy k-space column is taken as a lossy k-space slice;
correction is performed on each k-space slice after the lossy k-space slice in the current lossy k-space column by utilizing the correction parameter corresponding to the current lossy k-space column, to obtain a corrected k-space slice; and if the current lossy k-space column is not the first lossy k-space column, correction is performed on each k-space slice before the lossy k-space slice by utilizing a correction parameter corresponding to a previous lossy k-space column, to obtain a corrected k-space slice;
re-collection is performed for the motion damage data in the lossy k-space slice, correction is performed on re-collected data by utilizing the correction parameter corresponding to the last lossy k-space column, and correction is performed on data after the motion damage data in the lossy k-space slice by utilizing the correction parameter corresponding to the current lossy k-space column; and if the current lossy k-space column is not the first lossy k-space column, correction is performed on the data before the motion damage data in the lossy k-space slice by utilizing a correction parameter corresponding to a previous lossy k-space column, to obtain a repaired k-space slice; and
image reconstruction is performed on an obtained repaired k-space column to obtain a reconstructed image of the repaired k-space column.

Figure 4:
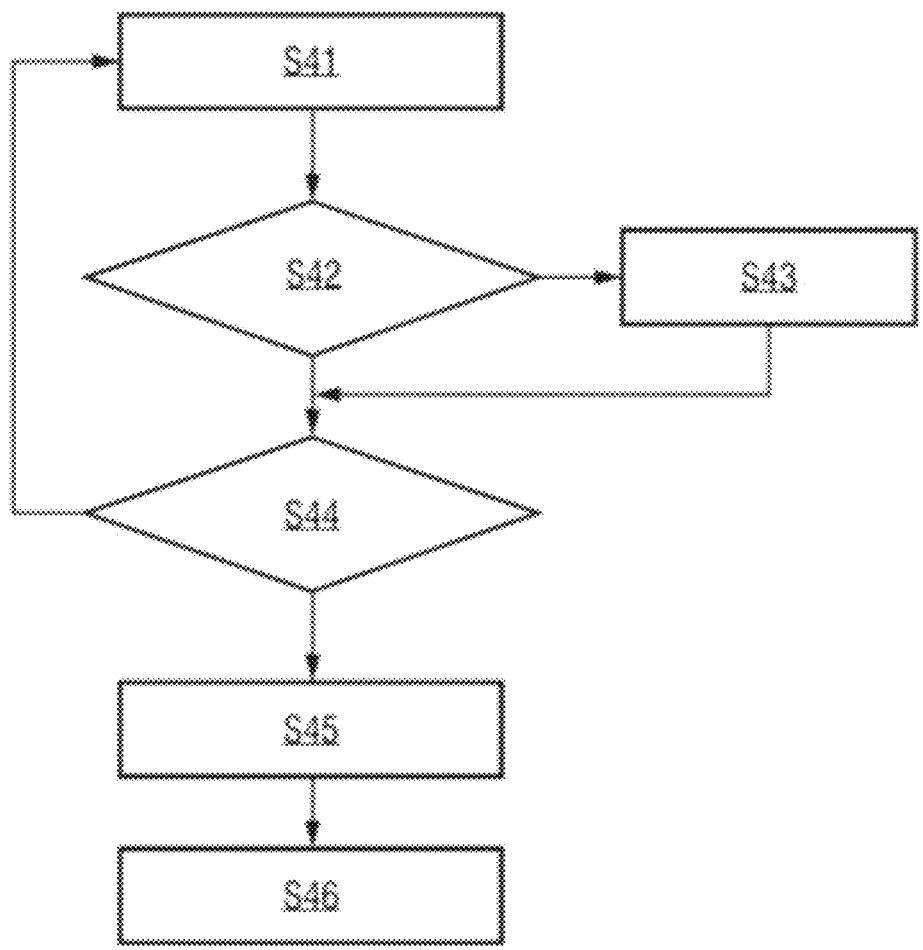
FIG. 4 is a schematic flowchart of an MR imaging method in an example of the present disclosure.

FIG. 4 is a schematic flowchart showing an MR imaging method in an example of the present disclosure. As shown in FIG. 4, the method may include the following operations.
step S41: collecting MR signal data every set time interval according to a stack-of-stars scheme or stack-of-spirals scheme;
step S42: determining whether a body motion is detected by using a pilot tone signal, and if the body motion is detected, performing step S43, or if no body motion is detected, performing step S44;
step S43: marking MR signal data collected during the body motion as motion damage data;
step S44: determining whether planned data collection is completed, and if the planned data collection is completed, performing step S45, or if the planned data collection is not completed, continuing to perform step S41;
step S45: performing re-collection for the motion damage data or performing re-collection for a k-space slice in which the motion damage data is located or performing re-collection for a k-space column in which the motion damage data is located; and
step S46: performing motion compensation and obtaining an MR image.

In this step, Implementation 2 and Implementation 4 for motion compensation in step S13 shown in FIG. 1 may be performed.

A method aspect in the aspects of the present disclosure is described in detail above, and an apparatus aspect in the aspects of the present disclosure will be described in detail below. For details not disclosed in the apparatus aspect of the present disclosure, reference may be made to the corresponding description in the method aspect of the present disclosure, and the details are not described herein again.

Figure 5:
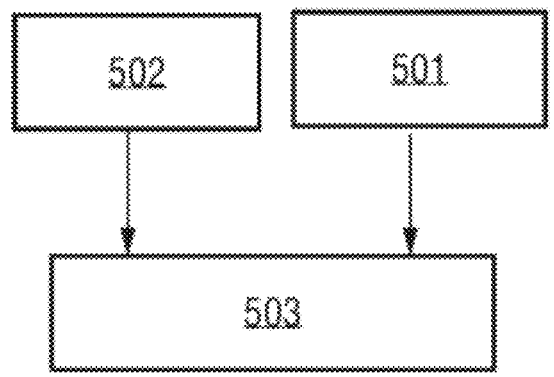
FIG. 5 is an exemplary structural diagram of an MR imaging apparatus in an aspect of the present disclosure.

FIG. 5 is an exemplary structural diagram of an MR imaging apparatus in an aspect of the present disclosure. As shown in FIG. 5, the apparatus may include: a signal collection module 501, a motion detection module 502, and a motion correction and imaging module 503.

The signal collection module 501 is configured to collect MR signal data every set time interval according to a stack-of-stars scheme or stack-of-spirals scheme, where in each time interval, MR signal data of each of a plurality of parallel slices arranged adjacently along a slice direction is collected as a radially-filled k-space slice or a spirally-filled k-space slice, and the k-space slices of the plurality of parallel slices are stacked into a k-space column along the slice direction.

The motion detection module 502 is configured to: in a process of collecting the MR signal data, perform motion detection by utilizing a pilot tone signal received by a plurality of coils, and output a corresponding body motion signal when a body motion is detected.

The motion correction and imaging module 503 is configured to mark MR signal data collected during the body motion as motion damage data based on the body motion signal; and perform motion correction on MR signal data after the motion damage data for k-space columns successively collected in a plurality of time intervals, and obtain a current MR image based on MR signal data obtained after the motion correction and MR signal data before the motion damage data.

In an implementation, the motion correction and imaging module 503 takes a k-space column with motion damage data from the k-space columns successively collected in a plurality of time intervals as a lossy k-space column, and when the number of lossy k-space columns is 1, calculates a correction parameter by utilizing reconstructed images of adjacent lossless k-space columns before and after the lossy k-space column, and performs correction on a reconstructed image of each lossless k-space column after the lossy k-space column by utilizing the calculated correction parameter, to obtain a corrected reconstructed image; and superimposes the corrected reconstructed image and a reconstructed image of each lossless k-space column before the lossy k-space column to obtain the current MR image.

In another implementation, the motion correction and imaging module 503 further repairs the lossy k-space column to obtain a reconstructed image of a repaired k-space column, and superimposes the reconstructed image of the repaired k-space column and the current MR image to obtain a current MR image.

There may be various methods for repairing the lossy k-space column to obtain a reconstructed image of a repaired k-space column. For example, the motion correction and imaging module 503 may perform re-collection for the lossy k-space column, and perform correction on a reconstructed image of a re-collected k-space column by utilizing the correction parameter, to obtain a reconstructed image of a repaired k-space column; or, the motion correction and imaging module 503 may also:

take a k-space slice with motion damage data in the lossy k-space column as a lossy k-space slice;
 perform correction on each k-space slice after the lossy k-space slice in the lossy k-space column by utilizing the correction parameter, to obtain a corrected k-space slice;
 remove the lossy k-space slice; or perform re-collection for the lossy k-space slice, and perform correction on a re-collected k-space slice by utilizing the correction parameter, to obtain a repaired k-space slice; or perform re-collection for the motion damage data in the lossy k-space slice, and perform correction on re-collected data and data after the motion damage data in the lossy k-space slice by utilizing the correction parameter, to obtain a repaired k-space slice; and
 perform image reconstruction on an obtained repaired k-space column to obtain a reconstructed image of the repaired k-space column.

In still another implementation, the motion correction and imaging module 503 may take a k-space column with motion damage data from the k-space columns successively collected in a plurality of time intervals as a lossy k-space column, and when the number of lossy k-space columns is greater than 1, take an adjacent lossless k-space column before the first lossy k-space column as a reference k-space column, and perform image reconstruction on the reference k-space column to obtain a reference image; and perform the following operations for each current lossy k-space column:

a. performing image reconstruction on an adjacent lossless k-space column after the current lossy k-space column to obtain a correction image corresponding to the current lossy k-space column;
 b. performing registration on the correction image by utilizing the reference image, to obtain a correction parameter corresponding to the current lossy k-space column;
 c. performing correction on a reconstructed image of each lossless k-space column after the current lossy k-space column and before a next lossy k-space column by utilizing the correction parameter, to obtain a corrected reconstructed image; and then superimposing a reconstructed image of each lossless k-space column before the first lossy k-space column and each corrected reconstructed image to obtain the current MR image.

In yet another implementation, for each current lossy k-space column, the motion correction and imaging module 503 may further repair the current lossy k-space column to obtain a reconstructed image of a repaired k-space column, and superimpose the reconstructed image of the repaired k-space column and the current MR image to obtain a current MR image.

There may be various methods for repairing the current lossy k-space column to obtain a reconstructed image of a repaired k-space column. For example, the motion correction and imaging module 503 may perform re-collection for the current lossy k-space column, and perform correction on a reconstructed image of a re-collected k-space column by utilizing a correction parameter corresponding to the last lossy k-space column, to obtain the reconstructed image of the repaired k-space column; or take a k-space slice with motion damage data in the current lossy k-space column as a lossy k-space slice;
 perform correction on each k-space slice after the lossy k-space slice in the current lossy k-space column by utilizing the correction parameter corresponding to the current lossy k-space column, to obtain a corrected k-space slice;
 if the current lossy k-space column is not the first lossy k-space column, perform correction on each k-space slice before the lossy k-space slice by utilizing a correction parameter corresponding to a previous lossy k-space column, to obtain a corrected k-space slice;
 remove the lossy k-space slice; perform re-collection for the motion damage data in the lossy k-space slice, perform correction on re-collected data by utilizing the correction parameter corresponding to the last lossy k-space column, and perform correction on data after the motion damage data in the lossy k-space slice by utilizing the correction parameter corresponding to the current lossy k-space column; and if the current lossy k-space column is not the first lossy k-space column, perform correction on the data before the motion damage data in the lossy k-space slice by utilizing a correction parameter corresponding to a previous lossy k-space column, to obtain a repaired k-space slice; and
 perform image reconstruction on an obtained repaired k-space column to obtain a reconstructed image of the repaired k-space column.

Figure 6:
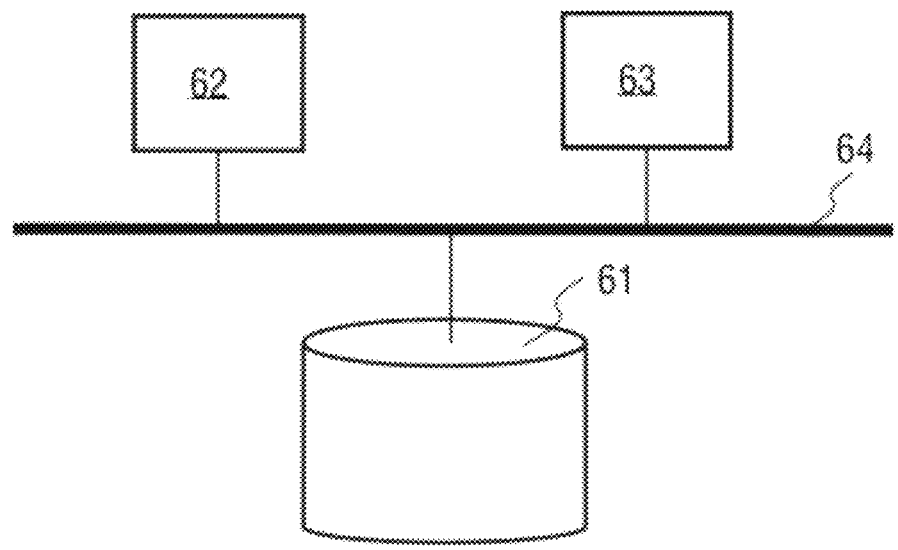
FIG. 6 is an exemplary structural diagram of another MR imaging apparatus in an aspect of the present disclosure.

FIG. 6 is a schematic structural diagram of another MR imaging apparatus in an aspect of the present application. The apparatus may be configured to implement the method shown in FIG. 1 or FIG. 4, or to implement the MR imaging apparatus shown in FIG. 5. As shown in FIG. 6, the apparatus may include: at least one memory 61, at least one processor 62, and at least one display 63. In addition, some other components, such as a communication port, may be further included. The components communicate with each other by a bus 64.

The at least one memory 61 is configured to store a computer program. In an implementation, the computer program may be understood as including various modules of the MR imaging apparatus shown in FIG. 5. In addition, the at least one memory 61 may further store an operating system, etc. The operating system includes, but is not limited to: an Android operating system, a Symbian operating system, a Windows operating system, a Linux operating system, etc.

The at least one processor 62 is configured to invoke the computer program stored in the at least one memory 61, and to perform the MR imaging method according to the aspects of the present disclosure. The processor 62 may be a CPU, a processing unit/module, an ASIC, a logic module or a programmable gate array, etc. The processor may perform data receiving and sending by using the communication port.

Specifically, the at least one processor 62 is configured to invoke the computer program stored in the at least one memory 61 to cause the system to perform the operations in the MR imaging method in any of the above implementations.

The at least one display 63 is configured to display the current MR image.

It needs to be noted that not all the steps and modules in the flows and structural diagrams described above are necessary, and some steps or modules may be omitted according to practical requirements. The execution order of the various steps is not fixed and may be adjusted according to requirements. The division of various modules is merely function division adopted for ease of description. In actual implementation, one module may be implemented by a plurality of modules, respectively, and functions of a plurality of modules may also be implemented by the same module. These modules may be located in the same device, or may be located in different devices.

It can be understood that hardware modules in various implementations described above may be implemented mechanically or electrically. For example, one hardware module may include a specifically designed permanent circuit or logic device (for example, a dedicated processor such as an FPGA or an ASIC) for accomplishing specific operations. The hardware module may also include a programmable logic device or circuit (for example, including a general-purpose processor or other programmable processors), which is configured temporarily by software, for performing specific operations. Whether the hardware module is implemented in a mechanical manner, by using a dedicated permanent circuit, or by using a temporarily configured circuit (for example, configured by software) may be decided according to costs and time.

In addition, an aspect of the present application further provides a computer-readable storage medium having a computer program stored thereon, where the computer program can be executed by a processor, to implement the MR imaging method according to the aspects of the present application. Specifically, a system or an apparatus with a storage medium may be provided, where software program codes for implementing the functions of any one of the implementations in the above aspects are stored on the storage medium, and a computer (or a CPU or an MPU) of the system or apparatus is caused to read out and execute the program codes stored in the storage medium. Moreover, an operating system operating on a computer may be caused to accomplish some or all of the actual operations based on an instruction of the program codes. The program codes read out from the storage medium may be further written into a memory provided in an expansion board inserted into the computer or written into a memory provided in an expansion unit connected to the computer, and then a CPU, etc. installed on the expansion board or the expansion unit is caused to execute some or all of the actual operations based on the instruction of the program codes, thereby implementing the functions of any one of the above implementations. The implementations of the storage medium for providing the program codes include a floppy disk, a hard disk, a magnetic optical disc, an optical disc (e.g., CD-ROM, CD-R, CD-RW, DVD-ROM, DVD-RAM, DVD-RW and DVD+RW), a magnetic tape, a non-volatile memory card and an ROM. Optionally, the program code may be downloaded from a server computer via a communication network.

It can be seen from the above solutions that, in the aspects of the present disclosure, the pilot tone signal is utilized to perform motion detection, the MR signal data collected during a body motion is marked as the motion damage data, then the MR signal data after the motion damage data is subjected to motion correction, and the current MR image is obtained based on the MR signal data obtained after the motion correction and MR signal data before the motion damage data, so that the collected image can be accurately corrected, thereby improving the MR imaging quality.

During MR imaging, the k-space column with the motion damage data is removed, so that the collected image is accurately corrected while an imaging speed may be increased. The k-space column with the motion damage data is repaired, so that the collected image is accurately corrected while the resolution of the image may be increased.

The above description is merely illustrative of the preferred aspects of the present disclosure and is not intended to limit the present disclosure. Any modifications, equivalent substitutions, improvements, etc. made within the spirit and principles of the present disclosure shall fall within the scope of protection of the present disclosure.

The invention claimed is:

1. A magnetic resonance (MR) imaging method, comprising:
    collecting MR signal data every set time interval according to a stack-of-stars scheme or stack-of-spirals scheme, wherein in each time interval, MR signal data of each of a plurality of parallel slices arranged adjacently along a slice direction is collected as a radially-filled k-space slice or a spirally-filled k-space slice, and the radially-filled k-space slices or the or spirally-filled k-space slices of the plurality of parallel slices are stacked into a k-space column along the slice direction;
    in a process of collecting the MR signal data, performing motion detection by utilizing a pilot tone signal received by a plurality of coils, and marking MR signal data collected during a body motion as motion damage data when the body motion is detected; and
    performing motion correction on MR signal data after the motion damage data for k-space columns successively collected in a plurality of the time intervals, and obtaining a current MR image based on MR signal data obtained after the motion correction and MR signal data before the motion damage data,
    wherein the performing motion correction on MR signal data after the motion damage data for k-space columns successively collected in a plurality of the time intervals, and obtaining current MR image based on MR signal data obtained after the motion correction and MR signal data before the motion damage data comprises:
    taking a k-space column with motion damage data from the k-space columns successively collected in a plurality of the time intervals as a lossy k-space column, wherein a number of lossy k-space columns is 1;
    calculating a correction parameter by utilizing reconstructed images of adjacent lossless k-space columns before and after the lossy k-space column, and performing correction on a reconstructed image of each lossless k-space column after the lossy k-space column by utilizing the calculated correction parameter, to obtain a corrected reconstructed image; and
    superimposing the corrected reconstructed image and a reconstructed image of each lossless k-space column before the lossy k-space column to obtain the current MR image.

2. The MR imaging method as claimed in claim 1, wherein the performing motion correction on MR signal data after the motion damage data for k-space columns successively collected in a plurality of the time intervals, and obtaining a current MR image based on MR signal data obtained after the motion correction and MR signal data before the motion damage data further comprises:

repairing the lossy k-space column to obtain a reconstructed image of a repaired k-space column, and superimposing the reconstructed image of the repaired k-space column and the current MR image based on MR signal obtained before the motion damage data to obtain a current MR image based on MR signal data obtained after the motion correction.

3. The MR imaging method as claimed in claim 2, wherein:
the repairing of the lossy k-space column to obtain a reconstructed image of a repaired k-space column comprises:
performing re-collection for the lossy k-space column, and performing correction on a reconstructed image of a re-collected k-space column by utilizing the correction parameter, to obtain a reconstructed image of a repaired k-space column; or comprises:
taking a k-space slice with motion damage data in the lossy k-space column as a lossy k-space slice;
performing correction on each k-space slice after the lossy k-space slice in the lossy k-space column by utilizing the correction parameter, to obtain a corrected k-space slice;
removing the lossy k-space slice; or performing re-collection for the lossy k-space slice, and performing correction on a re-collected k-space slice by utilizing the correction parameter, to obtain a repaired k-space slice; or performing re-collection for the motion damage data in the lossy k-space slice, and performing correction on re-collected data and data after the motion damage data in the lossy k-space slice by utilizing the correction parameter, to obtain a repaired k-space slice; and
performing image reconstruction on an obtained repaired k-space column to obtain a reconstructed image of the repaired k-space column.

4. A magnetic resonance (MRI) imaging method, comprising:
collecting MR signal data every set time interval according to a stack-of-stars scheme or stack-of-spirals scheme, wherein in each time interval, MR signal data of each of a plurality of parallel slices arranged adjacently along a slice direction is collected as a radially-filled k-space slice or a spirally-filled k-space slice, and the radially-filled k-space slices or the or spirally-filled k-space slices of the plurality of parallel slices are stacked into a k-space column along the slice direction;
in a process of collecting the MR signal data, performing motion detection by utilizing a pilot tone signal received by a plurality of coils, and marking MR signal data collected during a body motion as motion damage data when the body motion is detected; and
performing motion correction on MR signal data after the motion damage data for k-space columns successively collected in a plurality of the time intervals, and obtaining a current MR image based on MR signal data obtained after the motion correction and MR signal data before the motion damage data,
wherein the performing motion correction on MR signal data after the motion damage data for k-space columns successively collected in a plurality of the time intervals, and obtaining a current MR image based on MR signal data obtained after the motion correction and MR signal data before the motion damage data comprises:
taking a k-space column with motion damage data from the k-space columns successively collected in a plurality of the time intervals as a lossy k-space column, wherein the number of lossy k-space columns is greater than 1;
taking an adjacent lossless k-space column before a first lossy k-space column as a reference k-space column, and performing image reconstruction on the reference k-space column to obtain a reference image; and
performing the following operations for each current lossy k-space column:
performing image reconstruction on an adjacent lossless k-space column after the current lossy k-space column to obtain a correction image corresponding to the current lossy k-space column;
performing registration on the correction image by utilizing the reference image, to obtain a correction parameter corresponding to the current lossy k-space column;
performing correction on a reconstructed image of each lossless k-space column after the current lossy k-space column and before a next lossy k-space column by utilizing the correction parameter, to obtain a corrected reconstructed image; and
superimposing a reconstructed image of each lossless k-space column before the first lossy k-space column and each corrected reconstructed image to obtain the current MR image.

5. The MR imaging method as claimed in claim 4, wherein the following operations are further performed for each current lossy k-space column:
repairing the current lossy k-space column to obtain a reconstructed image of a repaired k-space column; and
superimposing the reconstructed image of the repaired k-space column and the current MR image based on MR signal data obtained before the motion damage data to obtain a current MR image based on MR signal data obtained after the motion correction.

6. The MR imaging method as claimed in claim 5, wherein the repairing of the current lossy k-space column to obtain a reconstructed image of a repaired k-space column comprises:
performing re-collection for the current lossy k-space column, and performing correction on a reconstructed image of a re-collected k-space column by utilizing a correction parameter corresponding to the last lossy k-space column, to obtain the reconstructed image of the repaired k-space column; or comprises:
taking a k-space slice with motion damage data in the current lossy k-space column as a lossy k-space slice;
performing correction on each k-space slice after the lossy k-space slice in the current lossy k-space column by utilizing the correction parameter corresponding to the current lossy k-space column, to obtain a corrected k-space slice; and if the current lossy k-space column is not the first lossy k-space column, performing correction on each k-space slice before the lossy k-space slice by utilizing a correction parameter corresponding to a previous lossy k-space column, to obtain a corrected k-space slice;
removing the lossy k-space slice; or performing re-collection for the lossy k-space slice, and performing correction on a re-collected k-space slice by utilizing the correction parameter corresponding to the last lossy k-space column, to obtain a repaired k-space slice; or performing re-collection for the motion damage data in the lossy k-space slice, performing correction on re-collected data by utilizing the correction parameter corresponding to the last lossy k-space column, and performing correction on data after the motion damage data in the lossy k-space slice by utilizing the correction parameter corresponding to the current lossy k-space column; and if the current lossy k-space column is not the first lossy k-space column, performing correction on the data before the motion damage data in the lossy k-space slice by utilizing a correction parameter corresponding to a previous lossy k-space column, to obtain a repaired k-space slice; and performing image reconstruction on an obtained repaired k-space column to obtain a reconstructed image of the repaired k-space column.

7. A magnetic resonance (MR) imaging apparatus, comprising:
a signal collection module configured to collect MR signal data every set time interval according to a stack-of-stars scheme or stack-of-spirals scheme, wherein in each time interval, MR signal data of each of a plurality of parallel slices arranged adjacently along a slice direction is collected as a radially-filled k-space slice or a spirally-filled k-space slice, and the radially-filled k-space slices or the or spirally-filled k-space slices of the plurality of parallel slices are stacked into a k-space column along the slice direction;
a motion detection module configured to: in a process of collecting the MR signal data, perform motion detection by utilizing a pilot tone signal received by a plurality of coils, and output a corresponding body motion signal when a body motion is detected; and
a motion correction and imaging module configured to mark MR signal data collected during the body motion as motion damage data based on the body motion signal; and perform motion correction on MR signal data after the motion damage data for k-space columns successively collected in a plurality of the time intervals, and obtain a current MR image based on MR signal data obtained after the motion correction and MR signal data before the motion damage data,
wherein the motion correction and imaging module is configured to take a k-space column with motion damage data from the k-space columns successively collected in a plurality of the time intervals as a lossy k-space column, and when a number of lossy k-space columns is 1, calculate a correction parameter by utilizing reconstructed images of adjacent lossless k-space columns before and after the lossy k-space column, and perform correction on a reconstructed image of each lossless k-space column alter the lossy k-space column by utilizing the calculated correction parameter, to obtain a corrected reconstructed image; and superimpose the corrected reconstructed image and a reconstructed image of each lossless k-space column before the lossy k-space column to obtain the current MR image.

8. The MR imaging apparatus as claimed in claim 7, wherein the motion correction and imaging module is further configured to repair the lossy k-space column to obtain a reconstructed image of a repaired k-space column, and superimpose the reconstructed image of the repaired k-space column and the current MR image based on MR signal data obtained before the motion damage data to obtain a current MR image based on MR signal data obtained after the motion correction.

9. The MR imaging apparatus as claimed in claim 8, wherein the motion correction and imaging module is configured to perform re-collection for the lossy k-space column, and perform correction on a reconstructed image of a re-collected k-space column by utilizing the correction parameter, to obtain a reconstructed image of a repaired k-space column; or take a k-space slice with motion damage data in the lossy k-space column as a lossy k-space slice;

perform correction on each k-space slice after the lossy k-space slice in the lossy k-space column by utilizing the correction parameter, to obtain a corrected k-space slice;

remove the lossy k-space slice; or perform re-collection for the lossy k-space slice, and perform correction on a re-collected k-space slice by utilizing the correction parameter, to obtain a repaired k-space slice; or perform re-collection for the motion damage data in the lossy k-space slice, and perform correction on re-collected data and data after the motion damage data in the lossy k-space slice by utilizing the correction parameter, to obtain a repaired k-space slice; and perform image reconstruction on an obtained repaired k-space column to obtain a reconstructed image of the repaired k-space column.

10. A magnetic resonance (MR) imaging apparatus, comprising:
a signal collection module configured to collect MR signal data every set time interval according to a stack-of-stars scheme or stack-of-spirals scheme, wherein in each time interval MR signal data of each of a plurality of parallel slices arranged adjacently along a slice direction is collected as a radially-filled k-space slice or a spirally-filled k-space slice, and the radially-filled k-space slices or the or spirally-filled k-space slices of the plurality of parallel slices are stacked into a k-space column along the slice direction;
a motion detection module configured to: in a process of collecting the MR signal data, perform motion-detection by utilizing a pilot-tone signal received by a plurality of coils, and output a corresponding body motion signal when a body motion is detected; and
a motion correction and imaging module configured to mark MR signal data collected during the body motion as motion damage data based on the body motion signal; and perform motion correction on MR signal data after the motion damage data for k-space columns successively collected in a plurality of the time intervals, and obtain a current MR image based on MR signal data obtained after the motion correction and MR signal data before the motion damage data,
wherein the motion correction and imaging module is configured to take a k-space column with motion damage data from the k-space columns successively collected in a plurality of the time intervals as a lossy k-space column, and when the number of lossy k-space columns is greater than 1,
take an adjacent lossless k-space column before a first lossy k-space column as a reference k-space column, and perform image reconstruction on the reference k-space column to obtain a reference image; and
perform the following operations for each current lossy k-space column:
perform image reconstruction on an adjacent lossless k-space column after the current lossy k-space column to obtain a correction image corresponding to the current lossy k-space column;
perform registration on the correction image by utilizing the reference image, to obtain a correction parameter corresponding to the current lossy k-space column;

perform correction on a reconstructed image of each lossless k-space column after the current lossy k-space column and before a next lossy k-space column by utilizing the correction parameter, to obtain a corrected reconstructed image; and superimpose a reconstructed image of each lossless k-space column before the first lossy k-space column and each corrected reconstructed image to obtain the current MR image.

11. The MR imaging apparatus as claimed in claim 10, wherein for each current lossy k-space column, the motion correction and imaging module is further configured to repair the current lossy k-space column to obtain a reconstructed image of a repaired k-space column, and superimpose the reconstructed image of the repaired k-space column and the current MR image based on MR signal data obtained before the motion damage data to obtain a current MR image based on MR signal data obtained after the motion correction.

12. The MR imaging apparatus as claimed in claim 11, wherein the motion correction and imaging module is configured to perform re-collection for the current lossy k-space column, and perform correction on a reconstructed image of a re-collected k-space column by utilizing a correction parameter corresponding to the last lossy k-space column, to obtain the reconstructed image of the repaired k-space column; or take a k-space slice with motion damage data in the current lossy k-space column as a lossy k-space slice;
perform correction on each k-space slice after the lossy k-space slice in the current lossy k-space column by utilizing the correction parameter corresponding to the current lossy k-space column, to obtain a corrected k-space slice;

if the current lossy k-space column is not the first lossy k-space column, perform correction on each k-space slice before the lossy k-space slice by utilizing a correction parameter corresponding to a previous lossy k-space column, to obtain a corrected k-space slice;

remove the lossy k-space slice; perform re-collection for the motion damage data in the lossy k-space slice, perform correction on re-collected data by utilizing the correction parameter corresponding to the last lossy k-space column, and perform correction on data after the motion damage data in the lossy k-space slice by utilizing the correction parameter corresponding to the current lossy k-space column; and if the current lossy k-space column is not the first lossy k-space column, perform correction on the data before the motion damage data in the lossy k-space slice by utilizing a correction parameter corresponding to a previous lossy k-space column, to obtain a repaired k-space slice; and perform image reconstruction on an obtained repaired k-space column to obtain a reconstructed image of the repaired k-space column.

13. An MR imaging apparatus, comprising: at least one non-transitory computer-readable medium and at least one processor, wherein:

the at least one non-transitory computer-readable medium is configured to store a computer program; and the at least one processor is configured to invoke the computer program stored in the at least one non-transitory computer-readable medium to perform the MR imaging method as claimed in claim 1.

14. A non-transitory computer-readable medium having a computer program stored thereon, wherein the computer program is executable by a processor to implement the MR imaging method as claimed in claim 1.

* * * * *